United States Patent
Swerts et al.

(10) Patent No.: US 8,921,228 B2
(45) Date of Patent: Dec. 30, 2014

(54) METHOD FOR SELECTIVELY DEPOSITING NOBLE METALS ON METAL/METAL NITRIDE SUBSTRATES

(71) Applicant: IMEC, Leuven (BE)

(72) Inventors: Johan Swerts, Kessel-lo (BE); Sven Van Elshocht, Leuven (BE); Annelies Delabie, Bierbeek (BE)

(73) Assignee: IMEC, Leuven (BE)

( * ) Notice: Subject to any disclaimer, the term of this patent is extended or adjusted under 35 U.S.C. 154(b) by 67 days.

(21) Appl. No.: 13/644,075

(22) Filed: Oct. 3, 2012

(65) Prior Publication Data

US 2013/0084700 A1  Apr. 4, 2013

Related U.S. Application Data

(60) Provisional application No. 61/542,876, filed on Oct. 4, 2011.

(51) Int. Cl.
| | |
|---|---|
| *H01L 21/44* | (2006.01) |
| *C23C 16/04* | (2006.01) |
| *C23C 16/18* | (2006.01) |
| *C23C 16/455* | (2006.01) |

(52) U.S. Cl.
CPC ............... *C23C 16/04* (2013.01); *C23C 16/18* (2013.01); *C23C 16/45536* (2013.01)
USPC .......................... 438/680; 438/677; 438/686

(58) Field of Classification Search
CPC ..................... H01L 21/28562; H01L 21/3141; H01L 21/28556
USPC ......................................... 438/680, 677, 686
See application file for complete search history.

(56) References Cited

U.S. PATENT DOCUMENTS

| | | | |
|---|---|---|---|
| 7,186,446 B2 | 3/2007 | Kim et al. | |
| 7,829,454 B2 | 11/2010 | Suzuki | |
| 2004/0084773 A1* | 5/2004 | Johnston et al. | 257/751 |
| 2006/0121733 A1* | 6/2006 | Kilpela et al. | 438/681 |
| 2007/0190782 A1* | 8/2007 | Park | 438/686 |
| 2010/0136776 A1 | 6/2010 | Huotari et al. | |
| 2011/0008961 A1* | 1/2011 | Lin | 438/658 |

OTHER PUBLICATIONS

Park, Sang-Joon et al., "Thermal and Plasma Enhanced Atomic Layer Deposition Ruthenium and Electrical Characterization as a Metal Electrode", Microelectronic Engineering, vol. 85, 2008, pp. 39-44.

(Continued)

*Primary Examiner* — Julia Slutsker
(74) *Attorney, Agent, or Firm* — McDonnell Boehnen Hulbert & Berghoff LLP (57) ABSTRACT

A method for forming a noble metal layer by Plasma Enhanced Atomic Layer Deposition (PE-ALD) is disclosed. The method includes providing a substrate in a PE-ALD chamber, the substrate comprising a first region having an exposed first material and a second region having an exposed second material. The first material comprises a metal nitride or a nitridable metal, and the second material comprises a non-nitridable metal or silicon oxide. The method further includes depositing selectively by PE-ALD a noble metal layer on the second region and not on the first region, by repeatedly performing a deposition cycle including (a) supplying a noble metal precursor to the PE-ALD chamber and contacting the noble metal precursor with the substrate in the presence of a carrier gas followed by purging the noble metal precursor, and (b) exposing the substrate to plasma while supplying ammonia and the carrier gas into the PE-ALD chamber.

18 Claims, 8 Drawing Sheets

(56) References Cited

OTHER PUBLICATIONS

Xie, Qi et al., "Comparison of the Ru Thin Films Grown on Si, TiN/Si and TaN/Si Substrates by Plasma Enhanced Atomic Layer Deposition", Solid State and Integrated-Circuit Technology, 2008, pp. 1231-1234.

Yim, Sung-Soo et al., "Nucleation Kinetics of Ru on Silicon Oxide and Silicon Nitride Surfaces Deposited by Atomic Layer Deposition", Journal of Applied Physics, vol. 103, 2008, pp. 113509-1 through 113509-9.

\* cited by examiner

METHOD FOR SELECTIVELY DEPOSITING NOBLE METALS ON METAL/METAL NITRIDE SUBSTRATES

CROSS-REFERENCE TO RELATED APPLICATIONS

This application claims priority under 35 U.S.C. §119(e) to U.S. Provisional Patent Application Ser. No. 61/542,876, filed on Oct. 4, 2011, and entitled "Method for Selective Deposition of a Semiconductor Material", the full disclosure of which is incorporated herein by reference.

TECHNICAL FIELD

The present disclosure relates to a method for selectively depositing noble metals on metal/metal nitride substrates.

BACKGROUND ART

Recently, noble metal growth and in particular ruthenium growth by atomic layer deposition (ALD) has attracted interest as an enabling material in future technology nodes for several applications, such as dynamic random access memory (DRAM) and interconnect metallization.

For DRAM metal-insulator-metal capacitors (MIMCAP), Ru and/or $RuO_2$ but also other noble metal(s) (oxides) are candidates to replace TiN electrodes in metal-insulator-metal capacitor structures. Ru has the advantage, when compared to other metals, of being still conducting when oxidized and hence does not contribute to the equivalent oxide thickness (EOT) of the capacitor. Moreover, $RuO_x$ has the advantage of reducing the leakage by trap density reduction of dielectrics such as strontium titanate (STO).

Electrochemical deposition of Cu for interconnect metallization traditionally uses Physical vapor deposition (PVD) of a Cu seed layer on top of a PVD Ta/TaN barrier to conduct the current. However, the step coverage limitations of the PVD technique compromise its use in future technology nodes. Barriers grown by deposition Atomic Layer Deposition (ALD) combined with seedless Cu electroplating is one of the metallization routes explored for sub-25 nm line critical dimensions (CD's). However, compatibility with seedless electroplating seriously limits the choice of materials. Among the different candidates, Ru layers have been identified as very promising to act as nucleation layers for direct Cu plating. Furthermore, high electromigration resistance has been demonstrated in for Cu metallization using a CVD Ru-liner showing that Ru is a valuable replacement for the conventional Ta. Next to the compatibility with Cu, Ru has a low resistivity which is very important for interconnect applications.

Ru, and in particular $RuO_2$ as well as other noble metal(s) (oxides) could also be of interest because of its high effective workfunction (EWF) for metal gates in complementary metal oxide semiconductor (CMOS) transistors or other applications like resistive random access memory (RRAM) as high EWF electrode.

It is known that ALD noble metal growth is highly substrate dependent. On Si oxides for example, large incubation times have been observed, while on metal nitrides, the incubation time is substantially less. US 2010/0136776 discloses that when differences in incubation periods are large enough, selective growth is possible on selected areas of the substrate; for example when depositing Ru on a substrate comprising oxide surfaces and metal nitride dots, Ru will grow selectively on the metal nitride dots.

Selective growth of noble metals is of interest in various areas, such as selectively growing the metal gate in transistors, bottom up fill in interconnects. Furthermore, the trend towards 3D devices will require depositions in complex structures with complex shapes.

However, when oxides cannot be used to enable selective growth on metal substrates, for example due to the incompatibility with the process flow, such as harmful oxidation of (parts of) the substrate during the oxidation deposition process, using the incubation time difference between oxide and metal (nitride) substrate is not possible.

Furthermore, when selective growth is only required up to a certain thickness and needs to be followed by a non-selective growth, more than one deposition chamber and/or technique needs to be used and this is unwanted.

SUMMARY OF THE DISCLOSURE

Example embodiments of the present disclosure provide a versatile method for selectively depositing noble metals on metal/metal nitride substrates.

The present disclosure provides a method for forming a noble metal layer by Plasma Enhanced Atomic Layer Deposition (PE-ALD). In an example, the method involves providing a substrate in a PE-ALD chamber, the substrate comprising a first region having an exposed first material and a second region having an exposed second material, where the first material comprises a metal nitride or a nitridable metal, and the second material comprises a non-nitridable metal or silicon oxide. The method further involves depositing selectively by PE-ALD a noble metal layer on the second region and not on the first region, by repeatedly performing a deposition cycle with either (a) or (b) as the first step: (a) supplying a noble metal precursor to the PE-ALD chamber and contacting the noble metal precursor with the substrate in the presence of a carrier gas followed by purging the noble metal precursor, and (b) exposing the substrate to plasma while supplying ammonia and the carrier gas into the PE-ALD chamber.

In an example, repeatedly performing the deposition cycle involves performing the deposition cycle a plurality of times. For instance, repeatedly performing the deposition cycle may include (i) performing step (a) followed by step (b) and (ii) once again performing step (a) followed by step (b). Further, the deposition cycle may be repeated additional times. In another example, performing the deposition cycle may include (i) performing step (b) followed by step (a) and (ii) once again performing step (b) followed by step (a). Further, the deposition cycle may be repeated additional times.

In an example, the disclosure describes a method for depositing by PE-ALD a noble metal-comprising layer whereby the incubation time with respect to a substrate is controlled by the nature of the plasma present in the PE-ALD chamber during the deposition cycle of the noble metal-comprising layer and not by the nature of the substrate. By exposing the substrate to plasma while supplying nitrogen and ammonia into the PE-ALD chamber during the PE-ALD noble metal process, the noble metal layer is deposited on the second region of the substrate but initial growth on the first region of the substrate is inhibited by making the first region less or not reactive towards the chemisorption of the noble metal precursor. A delayed growth occurs on the first region having an exposed first material where the first material comprises a metal nitride or a nitridable metal, whereas on the second region having an exposed second material where the second material comprises a non-nitridable metal or silicon oxide, growth occurs without delay, resulting in selective growth on the second region. Using this selectivity, complex conductive nanostructures may be obtained, for example by bottom up filling.

In some embodiments, the method may further comprise depositing non-selectively by PE-ALD a noble metal layer on the second region and on the first region, by repeatedly performing the deposition cycle with either (a) or (b) as the first step, and where at step (b) the ammonia is replaced by hydrogen.

In case a selective PE-ALD growth of a noble metal layer on the second region needs to be followed by a non-selective growth, this may be obtained in one and the same deposition chamber, during the same deposition cycle, simply by changing the plasma composition while the substrate is kept in the chamber.

In some embodiments, the method may further comprise performing an additional plasma treatment of the substrate prior to depositing non-selectively the noble metal layer.

In some embodiments the additional plasma treatment is performed in a $N_2$, $H_2$, or $N_2/H_2$ plasma or an inert gas plasma such as Ar or He.

In embodiments according to the present disclosure, the carrier gas is $N_2$ or a mixture of $N_2$ and an inert gas such as Ar or He.

In embodiments according to the present disclosure, the non-nitridable metal comprises a noble metal or a transition metal belonging to group 11.

In some embodiments the transition metal belonging to group 11 is selected from the group consisting of Cu, Ag and Au.

In embodiments according to the present disclosure the noble metal comprises Ru, Rh, Pd, Os, Ir or Pt.

In some embodiments, the noble metal may be ruthenium or an Ru-comprising alloy such as RuTa.

Further, in some embodiments, the metal nitride may comprise TiN, TaN or WN.

In some embodiments the metal nitride comprises further carbon and/or oxygen.

In embodiments according to the present disclosure, the nitridable metals are selected from the group of Ti, Ta, W, Al and any mixtures or alloys thereof.

In some embodiments, during the deposition cycle, the PE-ALD chamber may be continuously supplied with nitrogen and one of ammonia or hydrogen. In embodiments according to the present disclosure, the noble metal precursor is chosen from the group consisting of: bis(ethylcyclopentadienyl)Me and bis(cyclopentadienyl)Me having one or more alkyl substituents.

These as well as other aspects, advantages, and alternatives, will become apparent to those of ordinary skill in the art by reading the following detailed description, with reference where appropriate to the accompanying drawings.

BRIEF DESCRIPTION OF THE DRAWINGS

The disclosure will be further elucidated by means of the following description and the appended figures. Various exemplary embodiments are described herein with reference to the following figures, wherein like numerals denote like entities. The figures described are schematic and are non-limiting. Further, any reference signs in the claims shall not be construed as limiting the scope of the present disclosure. Still further, in the different figures, the same reference signs refer to the same or analogous elements.

FIG. 1 shows schematically the plasma enhanced ALD (PE-ALD) Ru cycle for Ru selective/non-selective deposition according to an example method of the disclosure: (a) plasma strike after providing Ru-precursor and purge in the presence of $N_2/NH_3$ (selective) or $N_2/H_2$ (non-selective); (b) plasma strike before providing Ru-precursor in the presence of $N_2/NH_3$ (selective) or $N_2/H_2$ (non-selective).

FIG. 2 shows example growth curves for PE-ALD Ru by $N_2/NH_3$ plasma on: (a) Ru-containing (Ru-seed and RuTa) substrates; (b) TiN substrates, and (c) $SiO_2$ substrates; (d) demonstration of selective growth of PE-ALD Ru on Ru-containing and TiN substrates.

FIG. 3 shows example growth curves for PE-ALD Ru by $N_2/NH_3$ plasma and $N_2/H_2$ plasma on (a) TiN and (b) $SiO_2$ substrates; (c) Ru-dose dependence of the incubation period on TiN for $N_2/H_2$ plasma.

FIG. 5 shows (a) the growth per cycle (GPC) of the PE-ALD Ru processes using various plasmas; (b) sheet resistance as function of thickness for Ru films deposited with various plasmas.

FIGS. 6 (a), (b), (c) illustrate schematically a few non-limitative examples wherein selective growth of Ru according to the method of the disclosure can be applied to simplify various device manufacturing flows.

DETAILED DESCRIPTION OF EXAMPLE EMBODIMENTS

The present disclosure will be described with respect to particular embodiments and with reference to certain drawings but the disclosure is not limited thereto. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments described throughout are to be construed as exemplary manners in which the disclosure may be implemented rather than as limiting the scope of the disclosure.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

State of the art chemistry to deposit ruthenium by plasma enhanced atomic layer deposition (PE-ALD) is bis(ethylcyclopentadienyl)Ru or $Ru(EtCp)_2$. However, the reported growth per cycle as well as the initial growth behavior varies strongly. This is likely due to the extreme sensitivity of the ALD Ru process to the substrate preparation and/or process specific conditions such as precursor dose and effective reactor temperature.

In general, ALD growth of Ru on Si oxides surfaces suffers from a large incubation period. Eventually nucleation at isolated sites occurs with island growth as a result. Typically, applying a plasma pretreatment on the surface prior to Ru deposition can create more reactive sites towards the $Ru(EtCp)_2$ precursor thereby reducing the incubation time. Whereas large incubation is reported on $SiO_2$ substrates, metal nitrides are typically reported as better substrates from nucleation point of view. Consistently state of the art reports very short times to no incubation time on TiN substrates. The very short to no incubation times on TiN substrates are reported irrespective of the gasses present in PE-ALD reactor when exposing the substrate to the plasma. Both in the presence of e.g. $Ar/NH_3$ and $Ar/N_2/H_2$ short to no incubation times of Ru on TiN are reported. It would be therefore expected that any mixture of these gasses would not lead to a different behavior in the initial growth on TiN.

Moreover, the longer incubation time on $SiO_2$ than on metal oxide or nitride substrates has been used in state of the art for selective growth of Ru on specific areas of a device, such as electrode. Thus, the selective growth is triggered in the state of the art by the nature of the substrate.

In various embodiments, the disclosure describes a method for depositing by PE-ALD a noble metal (ruthenium)-comprising layer whereby the incubation time with respect to a substrate is controlled by the plasma species that are present in the PE-ALD chamber during the deposition cycle of the noble metal (ruthenium)-comprising layer.

Throughout the disclosure Plasma enhanced ALD refers either to the "direct plasma" configuration or to the "remote plasma" configuration, both suitable to be applied in the method of the disclosure.

Advantageously by changing the plasma composition the selectivity of the noble metal (ruthenium) deposition/growth is changed with respect to a substrate, i.e. an initial selective growth can be turned into a non-selective growth and vice-versa, without taking the substrate out from the deposition chamber.

In different embodiments of the disclosure, when depositing Ru using a $N_2/NH_3$ plasma a very large incubation period was observed on metal nitride substrates (TiN, TaN), while nearly no incubation is observed on Ru-based substrates (Ru, Ru(Ta)) for the same deposition process, i.e. for the same plasma composition and sequence of steps in the deposition cycle.

When depositing Ru using a $N_2/H_2$ plasma, ruthenium growth is observed on metal nitrides (TiN, TaN) after a short incubation period. This short incubation period can be further tuned (made shorter/longer) by adapting amount of Ru precursor provided in the chamber (i.e. the Ru precursor pulse length). No incubation is observed for the same conditions ($N_2/H_2$ plasma) on Ru-based substrates (Ru, Ru(Ta)).

These findings can be applied for the selective growth of PE-ALD Ru on substrates comprising metal nitride and Ru-based materials by using $N_2/NH_3$ plasma that enables the deposition of Ru on top of Ru-based substrates, while showing a very large incubation period on metal nitride substrates.

It is further disclosed that by modifying the composition of the plasma from $N_2/NH_3$ to $N_2/H_2$, one can initiate the growth on the metal nitride and as such switch from a selective deposition to a non-selective one. Advantageously modifying the plasma composition can take place while the substrate is kept in the deposition chamber.

In embodiments of the disclosure, an additional plasma treatment is performed when switching from the $N_2/NH_3$ composition to the $N_2/H_2$ composition. The additional plasma treatment is aimed to reactivate the surface de-activated by the $N_2/NH_3$ plasma and thereby prepare the surface for the non-selective deposition with $N_2/H_2$. The plasma treatment may be performed before starting the non-selective deposition cycle with $N_2$ and/or $H_2$ plasma.

The switch in growth selectivity with respect to metal nitride surfaces can be applied to fill complex structures with a Ru-comprising material by simply changing the plasma composition during the growth, i.e. replacing $NH_3$ with $H_2$. For example, 3D structures can be filled taking advantage of the ALD conformality and switch in selectivity with respect to metal nitrides, replacing thereby several patterning steps.

In specific embodiments Ru thin films were deposited by PE-ALD in a 300 mm ALD chamber with direct plasma capability. The plasma is generated between the substrate and the showerhead using a high frequency generator. The power is typically 400 W and can be varied within a range from 50 W to 600 W, or within the more limited range from 100 W to 600 W. The ALD chamber is attached to a multiple chamber platform. The pressure in the chamber during ALD deposition was 3.5 Torr and the wafer temperature was kept at 330° C. unless mentioned otherwise. The temperature in the chamber during ALD deposition can be varied within a range from 200° C. to 450° C.

Prior to the deposition, the substrates were optionally degassed for 1 minute in an Ar ambient at 350° C. and low pressure (about 2 Torr). The degas step is performed in an anneal chamber attached to the same platform.

The method of the disclosure can be performed with any Ru precursor comprising bis-cyclopentadienyl and having none, 1 or more alkyl (methyl, ethyl, n-propyl, n-butyl, i-propyl, i-butyl, t-butyl, neopentyl, allyl, trimethylsilyl) substituents. Alternatively, other noble metals such as Rh, Pd, Os, Ir or Pt can be deposited using the method of the disclosure using a noble metal precursor comprising cyclopentadienyl and an alkyl substituent.

For supplying the Ru or noble metal precursor into the PE-ALD chamber nitrogen ($N_2$) is used as carrier gas. In specific embodiments $Ru(EtCp)_2$ was used as Ru-source which is a substance in liquid state. Alternatively the Ru (or other noble metal) source can be a substance in solid or gas phase. The carrier gas ($N_2$) passed through a bubbler containing $Ru(EtCp)_2$ at a temperature of 50° C. which was sufficient to saturate the ALD process.

Figure 1A:
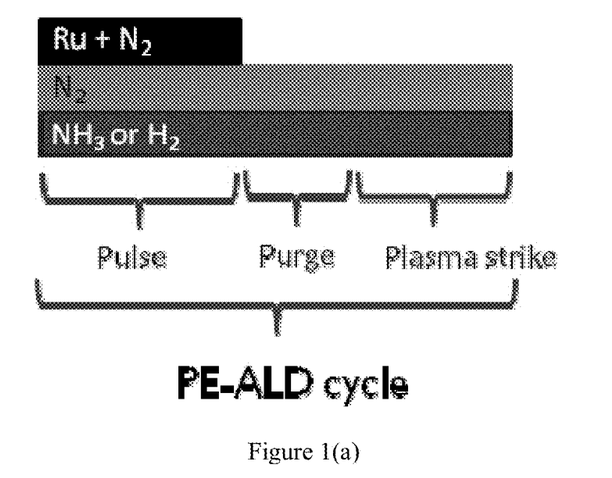
Figure 1B:
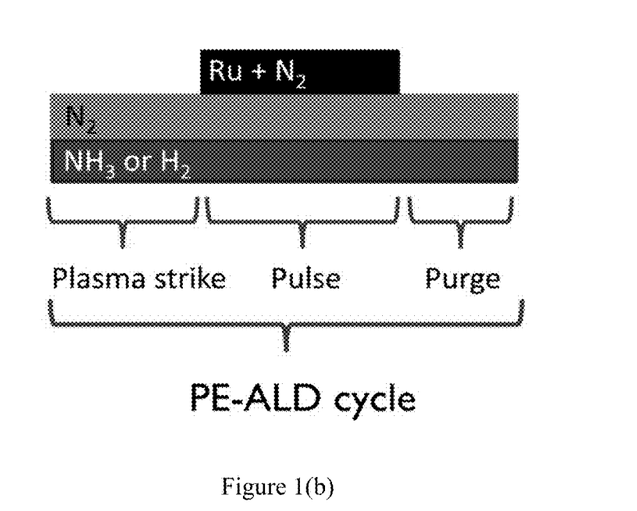

Both $N_2$ and one of $NH_3$ or $H_2$ are supplied continuously to the PE-ALD chamber during the deposition cycle as shown schematically in FIGS. 1(a) and (b). Alternatively, instead of $N_2$, a mixture of $N_2$ and an inert gas such as Ar or He can be supplied continuously.

For the selective deposition of Ru (or other noble metal) on a noble metal surface while no deposition/growth is performed on a metal nitride surface ammonia was supplied additionally to the chamber during the whole cycle. Plasma exposure was performed in the presence of nitrogen and ammonia ($N_2/NH_3$) either before supplying the Ru-precursor or after supplying and purging the Ru-precursor.

For the non-selective deposition of Ru (or other noble metal) on noble metal surface and metal nitride surface plasma exposure was performed in the presence of nitrogen and hydrogen ($N_2/H_2$) either before supplying the Ru-precursor or after supplying and purging the Ru-precursor.

In different embodiments the total pressure (process pressure) in the PE-ALD chamber was 3.5 Torr. For this process pressure, the partial pressure of $NH_3$ can be varied between 0.04 Torr up to about 3.2 Torr, or alternatively between 0.1 Torr and 2.5 Torr, or also between 0.4 Torr and 1.5 Torr. In the particular examples shown in FIG. 4 the partial pressure of $NH_3$ was selected to be 0.4 Torr, 0.9 Torr and, respectively 1.5 Torr.

Alternatively, for a process pressure of 3.5 Torr in the PE-ALD chamber, the partial pressure of $H_2$ can be varied between 0.1 Torr up to about 1 Torr, or within the more limited range between 0.2 Torr and 0.5 Torr. In the particular examples shown in FIG. 4 the partial pressure of $H_2$ was selected to be 0.2 Torr, and 0.5 Torr.

In different embodiments of the disclosure the $NH_3$ flow is between 250 sccm to 1500 sccm, and in one embodiment, 750 sccm. In different embodiments of the disclosure the $H_2$ flow is between 150 sccm to 450 sccm, with one embodiment being 300 sccm.

FIG. 1 shows schematically the PE-ALD Ru cycle for Ru selective/non-selective deposition according to a method of the disclosure: (a) plasma strike after providing Ru-precursor and purge in the presence of $N_2/NH_3$ (selective) or $N_2/H_2$ (non-selective); (b) plasma strike before providing Ru-precursor in the presence of $N_2/NH_3$ (selective) or $N_2/H_2$ (non-selective).

In the embodiments wherein the growth is non-selective the plasma exposure is performed in a $N_2/H_2$ ambient.

A purge may also be performed after the plasma strike and exposure to the second reactant ($N_2/NH_3$ or $N_2/H_2$). However, adding a purge after the second reactant does not influence the results. Due to the short life time of the excited species and the plasma generation at the wafer level (direct plasma), the purge after the plasma strike can be omitted since the byproducts are removed during the plasma pulse.

In specific embodiments the substrate is a Si wafer. Substrates comprising other semiconductor materials or material compatible with semiconductor manufacturing can be used.

According to embodiments of the disclosure, 10 nm TiN layer was deposited ex-situ by physical vapor deposition (PVD) on a Si wafer forming the herein further labeled 'metal nitride substrate'. In some other examples an in-situ PE-ALD TiN formed with tetrakis(dimethylamino)titanium (TDMAT)-precursor and $N_2/H_2$ plasma is used.

A metal nitride substrate comprises TiN, TaN, WN or any mixtures or alloys thereof. In alternative embodiments AlN can be used. The metal nitrides are either stoichiometric or non-stoichiometric compounds. Alternatively the metal nitride substrate can comprise a metal which can be easily converted (or at least a top layer thereof can be easily converted) to metal nitride, by e.g. a plasma nitridation process, also referred to as "nitridable" metal. Non-limiting examples of such nitridable metals are Ti, Ta W, Al and any mixtures or alloys thereof. A metal nitride substrate may comprise further other elements such as carbon and/or oxygen.

In some examples, a Ru-CVD seed or Ru-rich PVD Ru(Ta) layer was deposited on top of the TiN substrates prior to PE-ALD Ru deposition thereby forming the 'Ru-based substrates'. The Ru/Ta atomic ratio was about 10/1.

In the context of the present disclosure other noble metal substrates or substrates comprising an upper layer of metals like Cu which cannot be easily nitrided will behave similarly with the Ru-based substrate. Examples of non-nitridable metals are the noble metals or the alloys thereof and transition metals of group 11 such as Cu, Ag and Au. Among these especially copper is of particular interest as it is a metal largely used for forming interconnect structures in advanced semiconductor devices.

In other embodiments of the disclosure, 20 nm thermally grown $SiO_2$ substrates (on a Si wafer) also referred to 'as silicon oxide substrates' were formed. Alternatively the 'silicon oxide substrate' may comprise SiON.

The thickness of the Ru films and their within wafer non-uniformity (WiWNU) was determined by spectroscopic ellipsometry (SE) using a KLA-Tencor™ Aleris. 49 point maps with 10 mm edge exclusions were collected. In this way Ru films up to 10 nm on 10 nm TiN substrates could be measured reliably. The thickness limitation is set by the limited penetration depth of light in metals.

Film thickness values were also determined by x-ray reflectometry with a Jordan Valley™ x-ray diffractometer using Cu $K\alpha$ radiation. The same diffractometer was used to assess the crystallinity by x-ray diffraction (XRD). The sheet resistance (Rs) was measured using an Rs100 KLA-Tencor™ 4-points prober.

Impurity levels were measured by time of flight secondary ion mass spectroscopy (ToFSIMS) using an ION-TOF-IV instrument with a Ga source operating at a beam energy of 15 keV (area of 80×80 $\mu m^2$) for analysis and a Xe beam with an energy of 350 eV (sputter area of 500×500 $\mu m^2$) for depth profiling. Rutherford backscattering (RBS) using a 1 MeV He+ beam was used to determine the deposited amount of metal atoms.

Incubation Dependence on Substrate Composition

Figure 2A:
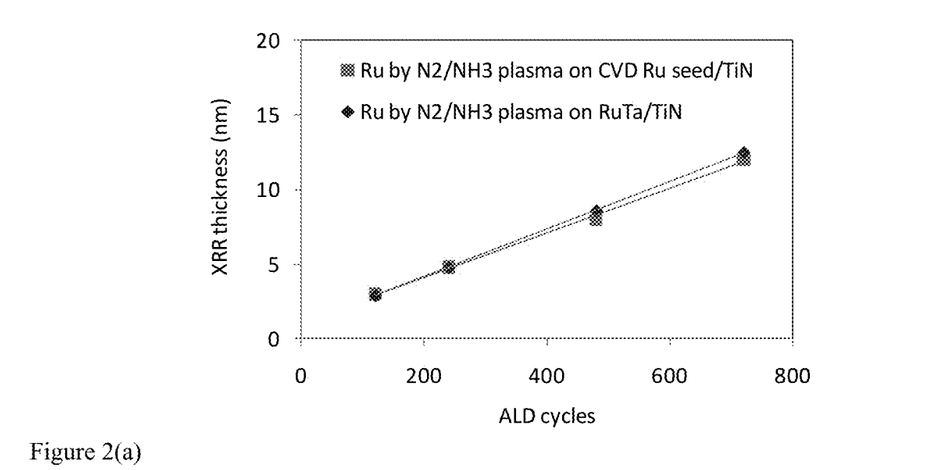

On Ru-based substrates (Ru seed or RuTa), Ru-growth shows a linear behavior for PE-ALD using $N_2/NH_3$ plasma. No significant incubation was observed, as shown in FIG. 2(a).

Figure 2B:
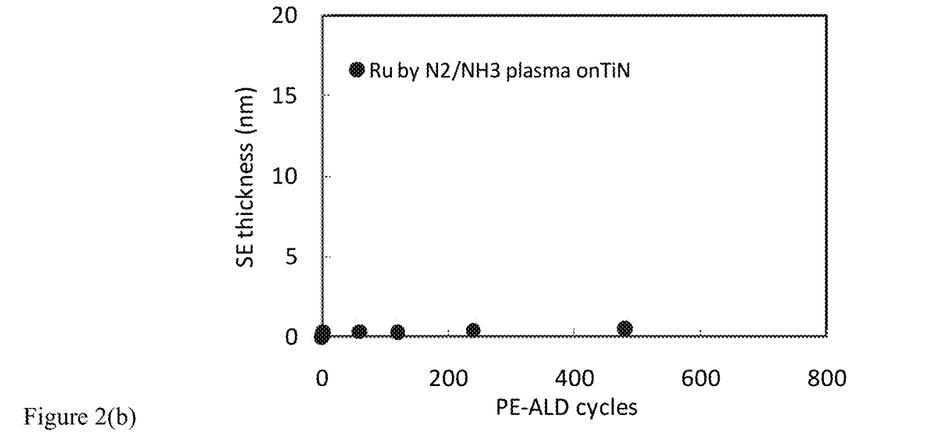

On TiN-substrates a very long incubation of Ru growth, i.e. more than 480 cycles, was found, as shown in FIG. 2(b). Even for very long precursor $Ru(EtCp)_2$ pulse times (i.e. 10× longer), and high source temperature (Ru ampoule at 35° C. and higher), no significant growth was obtained the first 480 cycles. Similarly large incubation times were observed on TaN substrates. The effect observed is very pronounced and 'tuning' the incubation time by increasing the amount of precursor provided does not lead to any significant growth.

Figure 2C:
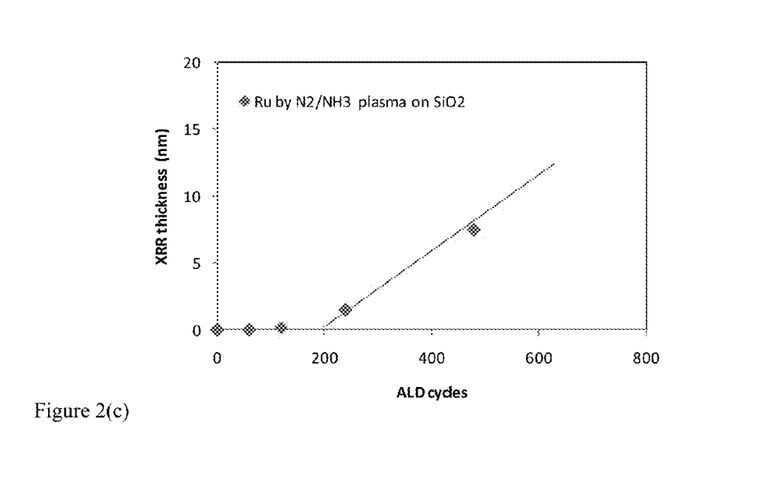

In the presence of $N_2/NH_3$ plasma, the incubation time of Ru growth on the metal nitride substrates was even larger than that on $SiO_2$ substrates as can be concluded when comparing FIGS. 2(b) and 2(c). This is highly unexpected in the light of the state of the art which typically reports an opposite behavior. Although the growth on SiO2 shows a significant incubation, the incubation period is still sufficiently different from that on TiN in presence of $N_2/NH_3$, thereby allowing selective deposition on $SiO_2$ while no growth is observed on TiN.

A similarly large incubation was found for Ru growth with $N_2/NH_3$ plasma process on in-situ deposited TiN from TDMAT and $N_2/H_2$ plasma. In this particular example, there is no O contamination on the TiN surface due to air exposure as might be the case for the ex-situ formed TiN with formation of an oxidized TiN. Therefore O contamination on the TiN surface as growth inhibition factor can be excluded.

Thus, in different embodiments, Ru growth from $Ru(EtCp)_2$ was performed using a $N_2/NH_3$ plasma on Ru-based substrates, while no growth was observed on metal nitride and oxidized metal nitride substrates.

The same behavior was found after a pretreatment with $N_2/HH_3$ plasma (prior to supplying the Ru precursor in the chamber) as shown in FIG. 1(b). Without wishing to be bound by theory, this appears to indicate that the incubation inhibition is due to a hinder in the absorption/chemisorption of Ru(EtCp)$_2$ on the TiN substrates after exposure to a N$_2$/NH$_3$ plasma before or after supplying and purging the Ru (or other noble metal) precursor in the chamber.

Figure 2D:
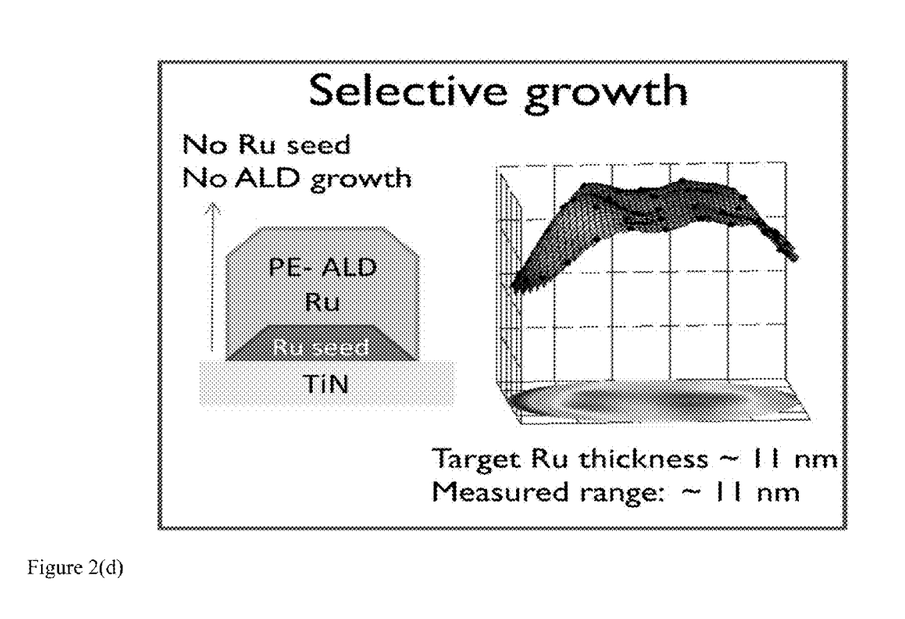

The selective growth on metal (Ru) with respect to metal nitride (TiN) was demonstrated by having a wafer which is already covered with TiN partially covered with a thin Ru seed. At edge areas of the wafer, the Ru seed was lacking. About 11 nm PE-ALD Ru deposition could be obtained on the area where the seed is present, whereas no deposition is obtained where the seed is not present, as shown in FIG. 2(d). A similar deposition process on a uniformly deposited Ru seed showed a uniform PE-ALD Ru deposition from center to edge.

Incubation Dependence on Plasma Composition

Figure 3A:
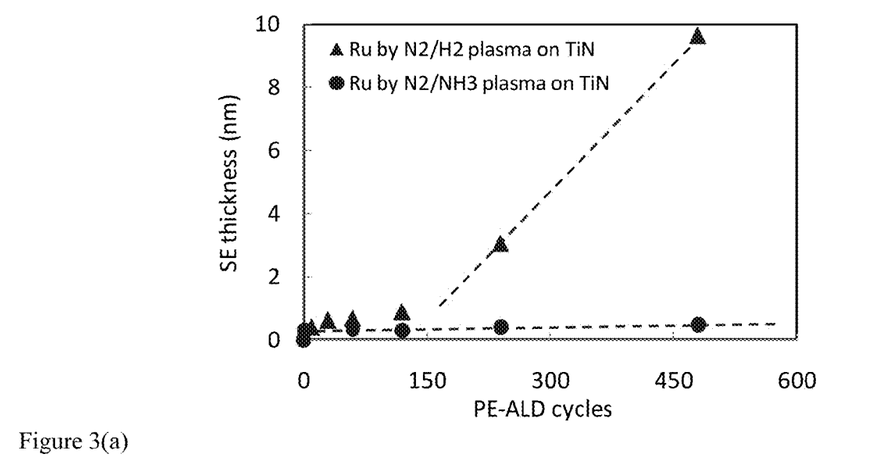
Figure 3B:
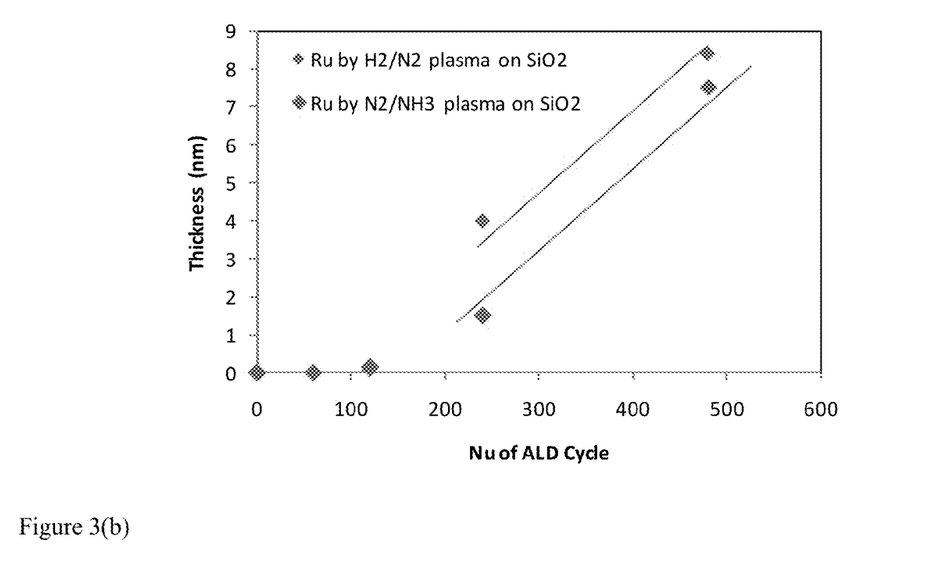

When replacing in the experiments above the N$_2$/NH$_3$ plasma, with N$_2$/H$_2$ plasma different results are obtained. Ru deposition can be obtained on TiN substrates as shown in FIG. 3(a). When comparing the impact of the plasma on SiO$_2$ substrates (FIG. 3(b)), a similar trend has been observed as on TiN. Comparing with N$_2$/NH$_3$ plasma, N$_2$/H$_2$ plasma on SiO$_2$ substrates leads to shorter incubation times. Although, the difference in incubation time on SiO$_2$ is smaller than on TiN substrates, it illustrates the effect of plasma selection used during the ALD growth of Ru (or any other noble metal) on the incubation time.

Figure 3C:
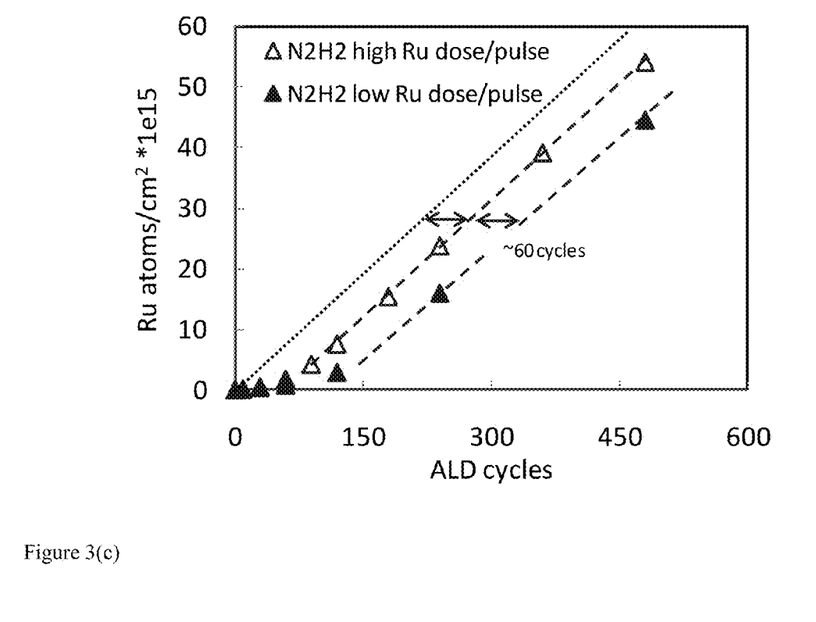

The incubation time can be tuned by increasing the Ru exposure per ALD cycle as shown in FIG. 3(c). A low and high dose of Ru/pulse was obtained by changing the Ru ampoule temperature from 50° C. to 85° C., respectively. This corresponds to a ~10× increase in vapor pressure which is a measure of the Ru dose. All the other parameters such as pulse, purge times were kept fixed.

A N$_2$/H$_2$ plasma pretreatment prior to Ru deposition did not significantly reduce the inhibition observed in the case of deposition by N2/NH3 plasma.

Differences in growth incubation are typically attributed to differences in active sites on substrate on which the Ru(EtCp)$_2$ chemisorbs after the plasma exposure. In that case, N$_2$/H$_2$ plasma would be more effective than N$_2$/NH$_3$ to create these active sites. A plasma pretreatment with the effective N$_2$/H$_2$ should create these active sites. However, similarly long incubation times have been observed for N$_2$/NH$_3$ plasma on TiN substrates that have undergone first a N$_2$/H$_2$ plasma treatment similar to the plasma exposure the wafers receive during the first 40 and 120 cycles of the Ru deposition with N$_2$/H$_2$ plasma. There was no air break between the plasma treatment and subsequent Ru deposition with N$_2$/NH$_3$ plasma. Surprisingly, no significant difference was observed with respect to the samples which were not treated first with N$_2$/H$_2$ plasma. The latter suggests that if reactive sites were present after the N$_2$/H$_2$ plasma treatment, the N$_2$/NH$_3$ plasma has deactivated them.

Figure 4:
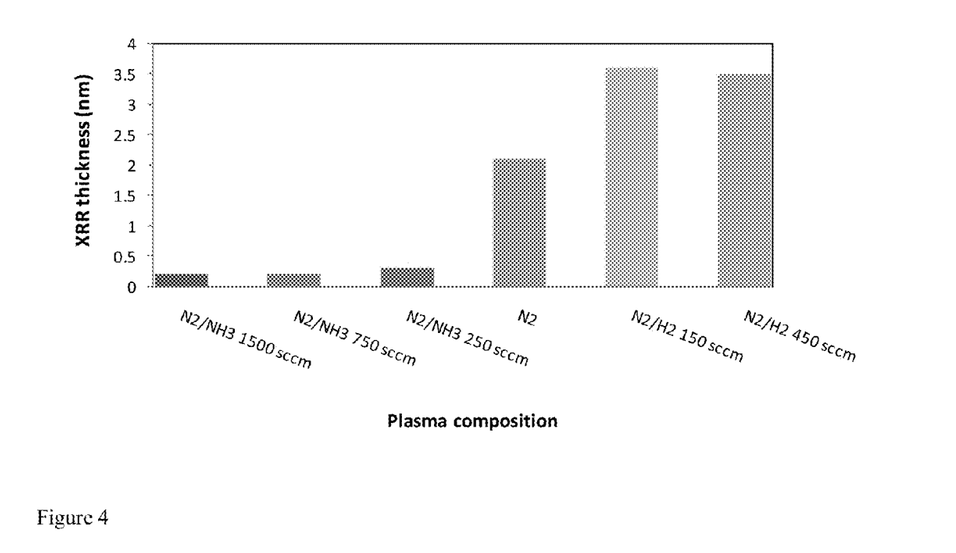
FIG. 4 shows an example thickness of PE-ALD Ru films after 240 cycles using various plasma compositions.

In FIG. 4, the impact of the plasma composition (from N$_2$/NH$_3$ 1500 sccm towards N$_2$/H$_2$ 450 sccm) on the Ru thickness after 240 ALD cycles on TiN substrates is shown. As soon as NH$_3$ is added to the N2, very long incubation occurs.

Figure 5A:
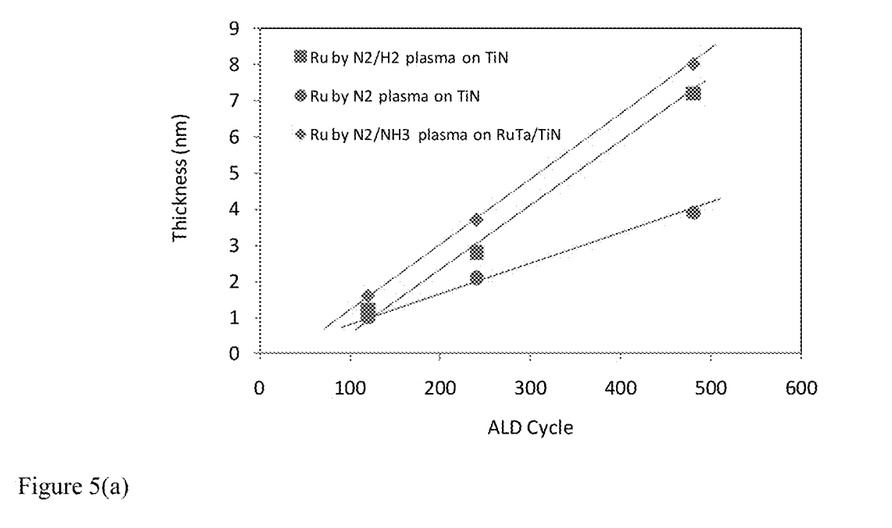
Figure 5B:
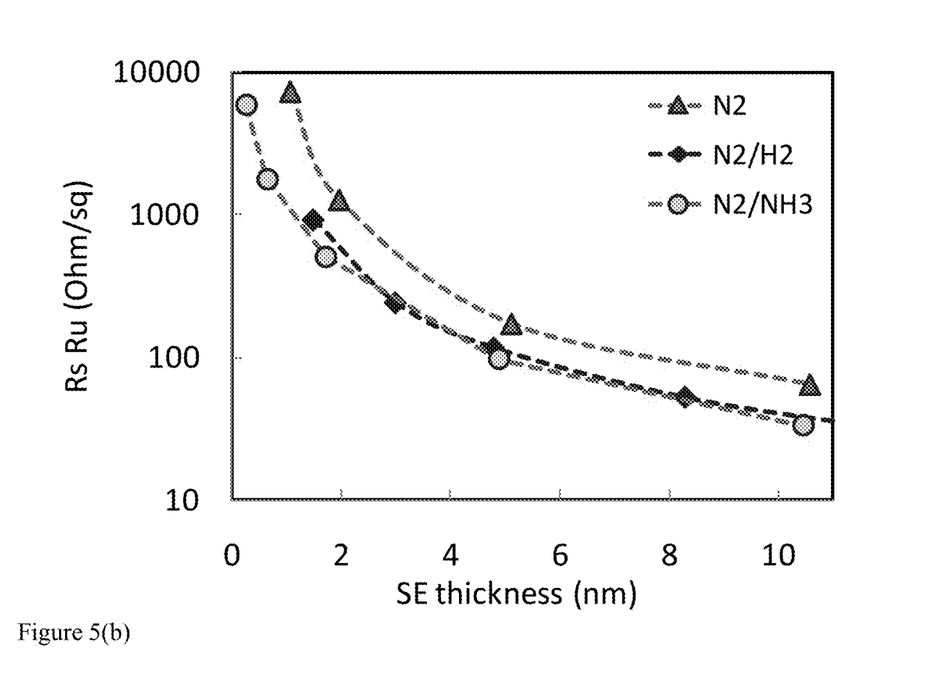

For pure N$_2$ ALD growth was observed without incubation, but the growth per cycle (GPC) was reduced suggesting that pure N$_2$ plasma is less suited to remove the ligands from the Ru precursor, possibly resulting in less dense films and more C impurities. For pure N$_2$ plasma, the resistivity is also higher in agreement with less dense, less pure layers as shown in FIG. 5(b). As soon as H$_2$ plasma is added, the expected thickness is obtained indicating that activated H species a more effective to remove the ligands.

GPC and Material Properties Dependence on Plasma Composition

When switching the plasma composition from N$_2$/NH$_3$ and N$_2$/H$_2$ no difference has been found in the growth per cycle values of Ru. GPC of about 0.016 nm is found for both N$_2$/NH$_3$ (on RuTa/TiN) and N$_2$/H$_2$ plasma (on TiN) as shown in FIG. 5(a). A higher precursor dose, longer plasma exposure, or higher plasma power (data not shown) did not significantly influence the GPC or resistivity indicating that the process is saturated. The only parameter that influenced the GPC was the reactor temperature. An increase in GPC to about 0.025 nm with increasing temperature up to about 400° C. was found. Note that for N$_2$ plasma (on TiN) a lower GPC was found as already discussed above.

The resistivity of the Ru films deposited by N$_2$/NH$_3$ and N$_2$/H$_2$ plasma is similar, even besides the ultra-thin film range, as shown in FIG. 5(b). Therefore switching the plasma composition from N$_2$/NH$_3$ and N$_2$/H$_2$ does not lead to differences in the quality (physical properties) of the Ru layer formed. For N$_2$ plasma, the resistivity is higher. This is likely due to more in-film impurities due to incomplete surface reactions. This suggests that the physical properties of the deposited Ru films are similar. XRD patterns show in all cases polycrystalline hexagonal Ru films. Thicker films show texture along the (101) direction on TiN.

Figure 6:
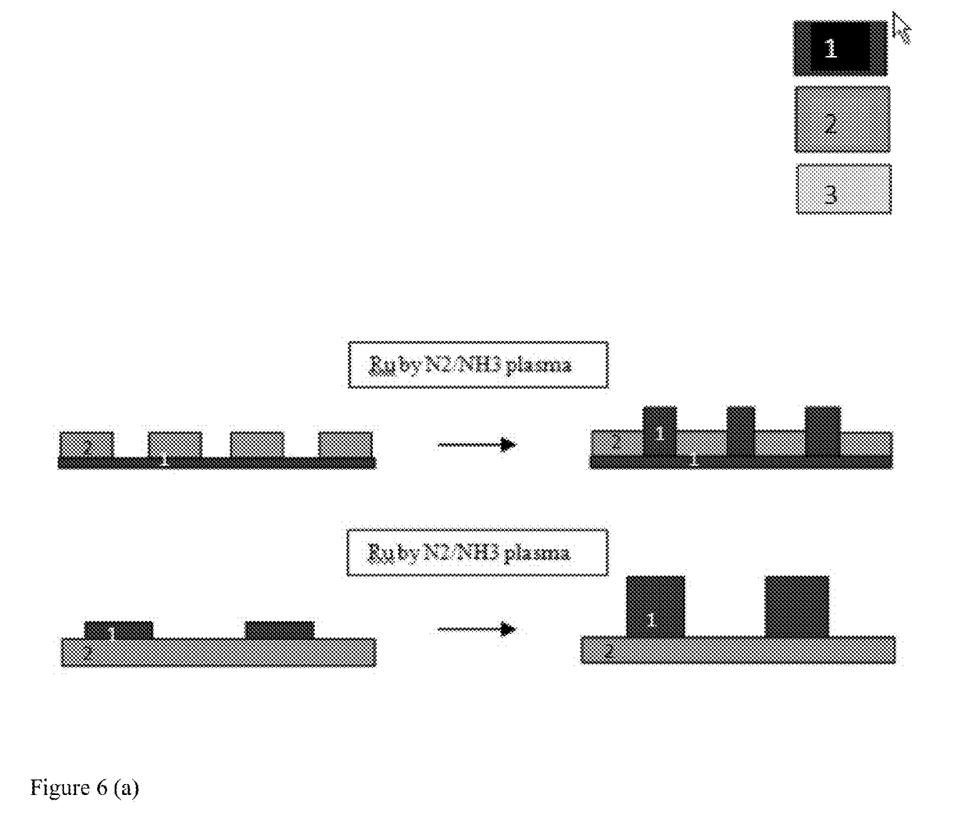

FIG. 6 illustrates schematically few non-limitative examples wherein selective growth of Ru according to the method of the disclosure can be applied to simplify various process flows: (a) selective growth of Ru (1) on top of Ru-comprising material (1), bottom up fill of a patterned structure defined in TiN (2) or pillars grown on top of predefined Ru dots/structures on a TiN substrate (2); (b) selective grown of Ru (1) on SiO$_2$ (3), bottom up fill with Ru of patterned structure defined in TiN (2), (c) Ru T-shape structures grown by PE-ALD by modifying the plasma composition according to the method of the disclosure, possibly without taking the substrate out of the PE-ALD chamber.

The various process flows referred above can be any manufacturing flows of a semiconductor device such as DRAM, MIMCAP, RRAM, interconnect metallization of advanced scaled devices as well as any other application wherein Ru selective growth and/or a switch between selective and non-selective growth can be advantageously applied.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims, along with the full scope of equivalents to which such claims are entitled. It is also to be understood that the terminology used herein is for the purpose of describing particular embodiments only, and is not intended to be limiting.

The invention claimed is:

1. A method for forming a noble metal layer by Plasma Enhanced Atomic Layer Deposition (PE-ALD) comprising the steps of:

providing a substrate in a PE-ALD chamber, the substrate comprising a first region comprising an exposed first material and a second region comprising an exposed second material, wherein the first material comprises a metal nitride or a nitridable metal, and the second material comprises a non-nitridable metal or silicon oxide;

selective deposition by PE-ALD of a first noble metal layer on the second region comprising the exposed second material, wherein the deposited first noble metal layer is deposited on the exposed second material and comprises an exposed portion, wherein the selective deposition on the second region comprises repeatedly performing a deposition cycle comprising the following steps:
(a) supplying a noble metal precursor to the PE-ALD chamber and contacting the noble metal precursor with the substrate in the presence of a carrier gas followed by purging the noble metal precursor, and
(b) exposing the substrate to plasma in the PE-ALD chamber while supplying ammonia and the carrier gas into the PE-ALD chamber; and after the selective deposition on the second region, performing a non-selective deposition by PE-ALD of a second noble metal layer on the second region and on the first region comprising the exposed first material, wherein the non-selective deposition on the second region and on the first region comprises non-selective deposition (i) on the exposed portion of the deposited first noble metal layer on the second region and (ii) on the exposed first material of the first region, wherein the non-selective deposition comprises repeatedly performing the deposition cycle, wherein at step (b) the ammonia is replaced by hydrogen ($H_2$).

2. The method according to claim 1, wherein the deposition cycle is performed with step (a) as a first step followed by step (b).

3. The method according to claim 1, wherein the deposition cycle is performed with step (b) as a first step followed by step (a).

4. The method according to claim 1, wherein the non-selective deposition is performed after the selective deposition in the same PE-ALD chamber while the substrate is kept in the chamber.

5. The method according to claim 1, further comprising performing an additional plasma treatment of the substrate prior to the non-selective deposition of the noble metal layer.

6. The method according to claim 5, wherein the additional plasma treatment is a $N_2$, $H_2$ or $H_2/H_2$ plasma or inert gas plasma.

7. The method according to claim 1, wherein the carrier gas is $N_2$ or a mixture of $N_2$ and an inert gas.

8. The method according to claim 1, wherein the non-nitridable metal comprises a noble metal or a transition metal belonging to group 11.

9. The method according to claim 8, wherein the transition metal belonging to group 11 is selected from the group consisting of Cu, Ag and Au.

10. The method according to claim 1, wherein the noble metal comprises Ru, Rh, Pd, Os, Ir or Pt.

11. The method according to claim 10, wherein the noble metal is Ru or RuTa alloy.

12. The method according to claim 1, wherein the metal nitride comprises TiN, TaN or WN.

13. The method according to claim 1, wherein the metal nitride comprises further carbon or oxygen.

14. The method according to claim 1, wherein the nitridable metals are selected from the group of Ti, Ta, W, Al and any mixtures or alloys thereof.

15. The method according to claim 1, wherein, during the deposition cycle, the PE-ALD chamber is continuously supplied with the carrier gas and one of ammonia or hydrogen.

16. The method according to claim 1, wherein the noble metal precursor is chosen from the group consisting of: bis(ethylcyclopentadienyl)Me and bis(cyclopentadienyl)Me having one or more alkyl substituents.

17. The method according to claim 1, wherein repeatedly performing the deposition cycle comprises performing the deposition cycle a plurality of times.

18. The method according to claim 1, wherein the selective deposition and the non-selective deposition is performed in one and the same deposition tool during the same deposition cycle by changing plasma composition while the substrate is kept in the chamber.

* * * * *